US010490624B2

(12) United States Patent
Mahler et al.

(10) Patent No.: US 10,490,624 B2
(45) Date of Patent: Nov. 26, 2019

(54) PROCESS FOR MANUFACTURING COLLOIDAL NANOSHEETS BY LATERAL GROWTH OF NANOCRYSTALS

(75) Inventors: Benoit Mahler, Paris (FR); Sandrine Ithurria, Paris (FR)

(73) Assignee: NEXDOT, Romainville (FR)

( * ) Notice: Subject to any disclaimer, the term of this patent is extended or adjusted under 35 U.S.C. 154(b) by 680 days.

(21) Appl. No.: 13/881,450

(22) PCT Filed: Oct. 24, 2011

(86) PCT No.: PCT/FR2011/000570
§ 371 (c)(1),
(2), (4) Date: Apr. 25, 2013

(87) PCT Pub. No.: WO2012/056121
PCT Pub. Date: May 3, 2012

(65) Prior Publication Data
US 2013/0220405 A1    Aug. 29, 2013

(30) Foreign Application Priority Data

Oct. 25, 2010 (FR) .................................. 10 04175

(51) Int. Cl.
*H01L 29/04* (2006.01)
*B82Y 30/00* (2011.01)
(Continued)

(52) U.S. Cl.
CPC .............. *H01L 29/04* (2013.01); *B82Y 30/00* (2013.01); *B82Y 40/00* (2013.01); *C30B 7/08* (2013.01);
(Continued)

(58) Field of Classification Search
CPC ....... H01L 21/02601; H01L 31/035227; H01L 31/035218; H01L 31/035209; C30B 29/50; C30B 7/08
See application file for complete search history.

(56) References Cited

U.S. PATENT DOCUMENTS 6,881,481 B2    4/2005  Hasegawa
2007/0032076 A1*  2/2007  Lee .......................... H01L 33/20
                                                   438/666

(Continued)

FOREIGN PATENT DOCUMENTS

CN    101544408 A    9/2009
CN    101717070 A    6/2010
(Continued)

OTHER PUBLICATIONS

Khan, M et al, "Optimization of Silica Content in Initial Sol—el Grain Particles for the Low Temperature Hydrothermal Synthesis of Titania Nanotubes", Crystal Growth & Design, vol. 9 No. 4, p. 1767-1774, (2009).*

(Continued)

*Primary Examiner* — Andrew J Golden
(74) *Attorney, Agent, or Firm* — Young & Thompson

(57) ABSTRACT

A process for manufacturing colloidal nanosheet, by lateral growth, on an initial colloidal nanocrystal, of a crystalline semiconductor material represented by the formula $M_nX_y$, where M is a transition metal and X a chalcogen. The process includes the following steps: The preparation of a first organic solution, non or barely coordinating used as a synthesis solvent and including at least one initial colloidal nanocrystal; The preparation of a second organic solution including precursors of M and X, and including an acetate salt. And the slow introduction over a predetermined time scale of a predetermined amount of the second solution in a predetermined amount of the first solution, at a predeter- (Continued)

Figure 1:
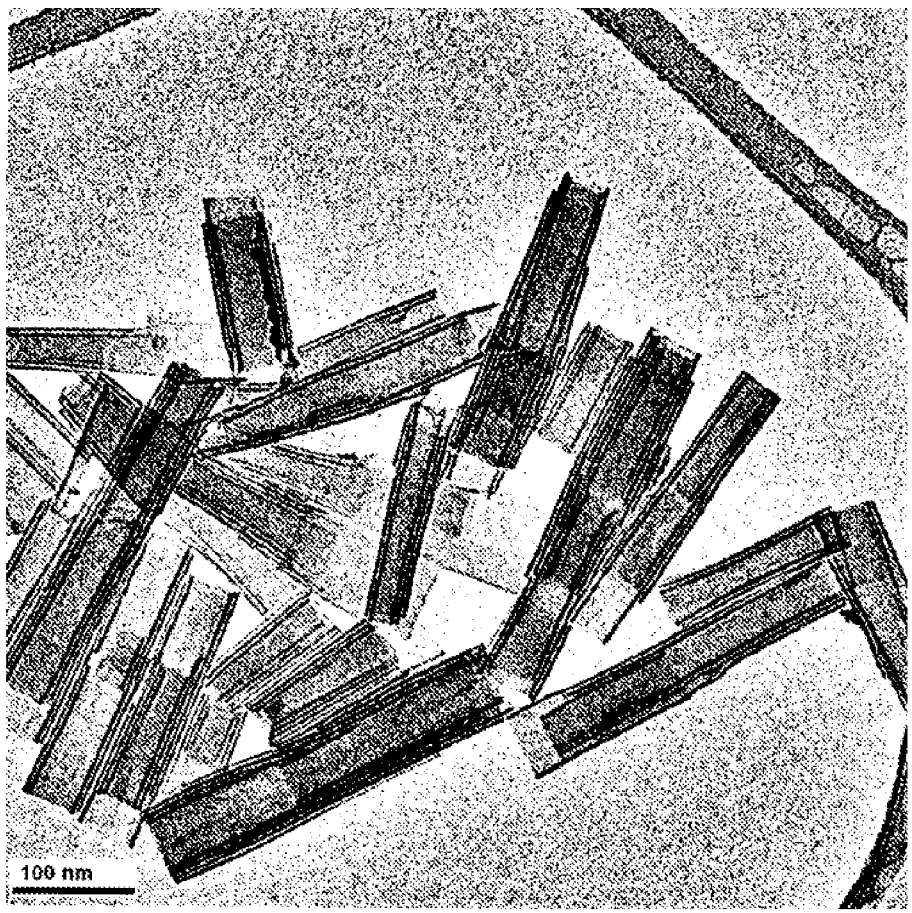

mined temperature for the growth of nanosheets. The use of the obtained material is also presented.

9 Claims, 4 Drawing Sheets

(51) Int. Cl.
| | |
|---|---|
| B82Y 40/00 | (2011.01) |
| C30B 29/16 | (2006.01) |
| C30B 29/46 | (2006.01) |
| C30B 29/48 | (2006.01) |
| H01L 21/02 | (2006.01) |
| H01L 31/0384 | (2006.01) |
| H01L 33/18 | (2010.01) |
| H01L 31/0296 | (2006.01) |
| H01L 31/032 | (2006.01) |
| H01L 31/0352 | (2006.01) |
| C30B 7/08 | (2006.01) |

(52) U.S. Cl.
CPC .............. *C30B 29/16* (2013.01); *C30B 29/46* (2013.01); *C30B 29/48* (2013.01); *H01L 21/02601* (2013.01); *H01L 31/0296* (2013.01); *H01L 31/032* (2013.01); *H01L 31/0322* (2013.01); *H01L 31/0384* (2013.01); *H01L 31/035218* (2013.01); *H01L 33/18* (2013.01); *Y02E 10/541* (2013.01); *Y10S 977/755* (2013.01); *Y10S 977/932* (2013.01)

(56) References Cited

U.S. PATENT DOCUMENTS

| | | | | |
|---|---|---|---|---|
| 2008/0246388 | A1* | 10/2008 | Cheon | G02F 2/02 313/501 |
| 2010/0140586 | A1 | 6/2010 | Char et al. | |
| 2010/0264334 | A1* | 10/2010 | Cao | C09K 11/025 250/459.1 |
| 2011/0220194 | A1* | 9/2011 | Kurtin | H01L 31/055 136/256 |

FOREIGN PATENT DOCUMENTS

| | | |
|---|---|---|
| EP | 2163301 A2 | 3/2010 |
| JP | 2003-073120 | 3/2003 |
| WO | 2010/029508 A2 | 3/2010 |

OTHER PUBLICATIONS

Di Paola, A, et al, "Preparation of Polycrystalline TiO2 Photocatalysts Impregnated with Various Transition Metal Ions: Characterization and Photocatalytic Activity for the Degradation of 4-Nitrophenol", Journal of Physical Chemistry B, vol. 106, p. 637-645, (2002).*
Yan, X et al, "Antiphotocorrosive photocatalysts containing CdS nanoparticles and exfoliated TiO2 nanosheets", Journal of Materials Research, vol. 25, No. 1, p. 182-188, (Jan. 2010).*
Zhao, J. et al, "Selective Growth of Crystalline SnO2 on the Polar Surface of ZnO Nanobelts", Crystal Growth & Design, vol. 6, No. 12, p. 2643-2647, (2006).*
Wang, X. et al, "Wavelength-Sensitive Photocatalytic Degradation of Methyl Orange in Aqueous Suspension over Iron(III)-doped TiO2 Nanopowders under UV and Visible Light Irradiation", Journal of Physical Chemistry B, vol. 110, p. 6804-6809, (2006).*
Ling, B. et al, "A SnO2 Nanoparticle/Nanobelt and Si Heterojunction Light-Emitting Diode", Journal of Physical Chemistry C, vol. 114, p. 18390-18395, (2010).*
Kim, Y, L, et al, "The growth and optical properties of CdSSe nanosheets", Nanotechnology, vol. 20, 095605.*
Colvin, V. L. et al, "Light-emitting diodes made from cadmium selenide nanocrystals and a semiconducting polymer", Nature, vol. 370, p. 354-357.*
Cui et al, Photophysical and Photocatalytic Properties of Core-Ring Structured NiCo2O4 Nanoplatelets, 2009 J. Phys Chem. C., 113, 14083-14087. (Year: 2009).*
Cui et al, Core-Ring Structured NiCo2O4 Nanoplatelets: Synthesis, Characterization, and Electrocatalytic Applications, 2008, Adv Func. Mater. 18, 1440-1447. (Year: 2008).*
Guo et al, Zinc oxide nanostructures: epitaxially growing from hexagonal zinc nanostructures. Nanotechnology 2008, 19, 445710(8pp). (Year: 2008).*
Ah et al., "Size-Controlled Synthesis of Machinable Single Crystalline Gold Nanoplates", Chemistry of Materials 2005, vol. 17, pp. 5558-5561.
Deng et al., "New Method to Single-Crystal Micrometer-Sized Ultra-Thin Silver Nanosheets: Synthesis and Characterization", Journal of Physical Chemistry C, 2009, vol. 113, pp. 867-873.
Efros et al., "The Electronic Structure of Semiconductor Nanocrystals", Annu. Rev. Mater. Sci., 2000, vol. 30, pp. 475-521.
Ekimov et al., "Quantum size effect in three-dimensional microscopic semiconductor crystals", JETP Lett, 1981, vol. 34, No. 6, pp. 345-349.
Ekimov et al., "Size quantization of the electron energy spectrum in a microscopic semiconductor crystal", JETP Lett, 1984, vol. 40, No. 8, pp. 1136-1139.
El-Sayed, Mostafa A., "Some Interesting Properties of Metals Confined in Time and Nanometer Space of Different Shapes", Accounts of Chemical Research, 2001, vol. 34, No. 4, pp. 257-264.
Fan et al., "Solvothermal Synthesis and Photoluminescent Properties of ZnS/Cyclohexylamine: Inorganic-Organic Hybrid Semiconductor Nanowires", Journal of Physical Chemistry B, 2006, vol. 110, pp. 12948-12953.
Hernandez et al., "High-yield production of graphene by liquid-phase exfoliation of graphite", Nature Nanotechnology, 2008, vol. 3, pp. 563-568.
Hu et al. "Hydrothermal Precursor Approach to Single-crystal PbS Nanosheets at Low Temperature", Chinese Journal of Inorganic Chemistry, 2007, vol. 23, No. 8, pp. 1403-1408.
Huang et al., "Investigation of the Growth Process of Gold Nanoplates Formed by Thermal Aqueous Solution Approach and the Synthesis of Ultra-Small Gold Nanoplates", Journal of Physical Chemistry C, 2007, vol. 111, pp. 2533-2538.
Ithurria et al., "Quasi 2D Colloidal CdSe Platelets with Thicknesses Controlled at the Atomic Level", Journal of the American Chemical Society, 2008, vol. 130, pp. 16504-16505.
Joo et al., "Low-Temperature Solution-Phase Synthesis of Quantum Well Structured CdSe Nanoribbons", Journal of the American Chemical Society, 2006, vol. 128, pp. 5632-5633.
Karanikolos et al., "Water-based synthesis of ZnSe nanostructures using amphiphilic block copolymer stabilized lyotropic liquid crystals as templates", Nanotechnology, 2006, vol. 17, No. 13, pp. 3121-3128.
Kumar et al., "Shape Control of II-VI Semiconductor Nanomaterials", Small, 2006, vol. 2, No. 3, pp. 316-329.
Li et al., "Mass Synthesis of Large, Single-Crystal Au Nanosheets Based on a Polyol Process", Advanced Functional Materials, 2006, vol. 16, pp. 83-90.
Li et al., "Hydrothermal synthesis of novel sandwich-like structured ZnS/octylamine hybrid nanosheets", Solid State Communications, 2004, vol. 130, pp. 619-622.
Manna et al., "Synthesis of Soluble and Processable Rod-, Arrow-, Teardrop-, and Tetrapod-Shaped CdSe Nanocrystals", Journal of the American Chemical Society, 2000, vol. 122, pp. 12700-12706.
Murray et al., "Synthesis and Characterization of Nearly Monodisperse CdE (E=S, Se, Te) Semiconductor Nanocrystallites", Journal of the American Chemical Society, 1993, vol. 115, pp. 8706-8715.
Park et al., "Synthesis of Monodisperse Spherical Nanocrystals", Angewandte Chemie Internationale Edition, 2007, vol. 46, pp. 4630-4660.
Park et al., "Synthesis, Optical Properties, and Self-Assembly of Ultrathin Hexagonal In2S3 Nanoplates", Angewandte Chemie International Edition, 2006, vol. 45, pp. 4608-4612.

(56) References Cited

OTHER PUBLICATIONS

Peng et al., "Shape control of CdSe nanocrystals", Nature, 2000, vol. 404, pp. 59-61.
Puntes et al., "Synthesis of hcp-Co Nanodisks", Journal of the American Chemical Society, 2002, vol. 124, pp. 12874-12880.
Rossetti et al., "Quantum size effects in the redox potentials, resonance Raman spectra, and electronic spectra of CdS crystallites in aqueous solution", The Journal of Chemical Physics, 1983, vol. 79, pp. 1086-1088.
Sasaki et al., "Semiconductor Nanosheet Crystallites of Quasi-TiO2 and Their Optical Properties", Journal of Physical Chemistry B, 1997, vol. 101, pp. 10159-10161.
Si et al., "Rare-Earth Oxide Nanopolyhedra, Nanoplates, and Nanodisks", Angewandte Chemie International Edition, 2005, vol. 44, pp. 3256-3260.
Sigman et al., "Solventless Synthesis of Monodisperse Cu2S Nanorods, Nanodisks, and Nanoplatelets", Journal of the American Chemical Society, 2003, vol. 125, pp. 16050-16057.
Sun et al., "Shape-Controlled Synthesis of Gold and Silver Nanoparticles", Science, 2002, vol. 298, pp. 2176-2179.
Vassiliou et al., "Magnetic and optical properties of γ-Fe2O3 nanocrystals", J. Appl. Phys., 1993, vol. 73, No. 10, pp. 5109-5116.
Xu et al., "Selective synthesis of copper nanoplates and nanowires via a surfactant-assisted hydrothermal process", Materials Chemistry and Physics, 2010, vol. 120, pp. 1-5.
Xu et al., "Single-Crystal Metal Nanoplatelets: Cobalt, Nickel, Copper, and Silver", Crystal Growth & Design, 2007, vol. 7, No. 9, pp. 1904-1911.
Yao et al., "Flexible Wurtzite-Type ZnS Nanobelts with Quantum-Size Effects: a Diethylenetriamine-Assisted Solvothermal Approach", Small, 2005, vol. 1, No. 3, pp. 320-325.
Yu et al., "Iant Zeeman splitting in nucleation-controlled doped CdSe:Mn2+ quantum nanoribbons", Nature Material, 2010, vol. 9, pp. 47-53.
Yu et al., "Shape and Phase Control of ZnS Nanocrystals: Template Fabrication of Wurtzite ZnS Single-Crystal Nanosheets and ZnO Flake-like Dendrites from a Lamellar Molecular Precursor ZnS-(NH2 CH2 CH2 NH2)0.5", Advanced Materials 2002, vol. 14, No. 4, pp. 296-300.
Yu et al., "Synthesis and Characterization of Porous Magnesium Hydroxide and Oxide Nanoplates", Journal of Physical Chemistry B, 2004, vol. 108, pp. 64-70.
Yu, et al., "Single Unit Cell Thick Samaria Nanowires and Nanoplates", Journal of the American Chemical Society, 2006, vol. 128, pp. 1786-1787.
Yu et al., "Experimental Determination of the Extinction Coefficient of CdTe, CdSe, and CdS Nanocrystals", Chemistry of Materials, 2003, vol. 15, pp. 2854-2860.
Zhang et al., "Large-Scale Aqueous Synthesis and Growth Mechanism of Single-Crystalline Metal Nanoscrolls at Room Temperature: The Case of Nickel", Chemistry Materials, 2010, vol. 22, No. 16, pp. 4721-4727.
Zhang et al., "Nanocrystalline Metal Chalcogenides Obtained Open to Air: Synthesis, Morphology, Mechansim, and Optical Properties", Journal of Physical Chemistry C, 2009, vol. 113, No. 35, pp. 15492-15496.
Jun et al., "Shape Control of Semiconductor and Metal Oxide Nanocrystals through Nonhydrolytic Colloidal Routes", Angewandte Chemie International Edition, 2006, vol. 45, pp. 3414-3439.
French Search Report, dated Aug. 30, 2011, from the corresponding French patent application FR1004175.
International Search Report, dated Dec. 6, 2011, from the the corresponding international patent application PCT/FR2011/000570.
Celso de Mello Donega, "Synthesis and properties of colloidal heteronanocrystals", Chemical Society Reviews, vol. 10, Oct. 2010, pp. 1512-1546, Utrecht, Netherlands.
Zhang et al., "Nanocrystalline Metal Chalcogenides obtained open to air : synthesis, morphology, mechanism and optical properties", Journal of Physical Chemistry C, vol. 113, Aug. 2009, pp. 15492-15496, Shanghai, China.
Milliron et al., "Colloid nanocrystal heterostructures with linear and branched topology", Nature Publishing Group, vol. 430, Jul. 2004, pp. 190-195, Lecce Lecce, Italy.
Talapin, D. et al., "Highly Emissive Colloidal CdSe/CdS Heterostructures of Mixed Dimensionality," Nano Letters, vol. 3, No. 12, Dec. 2003, pp. 1677-1681.

* cited by examiner

PROCESS FOR MANUFACTURING COLLOIDAL NANOSHEETS BY LATERAL GROWTH OF NANOCRYSTALS

FIELD OF THE INVENTION

The present invention provides a method for the manufacturing of colloidal nanosheets by lateral extension of pre-existing nanocrystals or nanosheets. The described extension growth is obtained by continuous addition of precursors over a predetermined duration. The present invention also relates to the obtained nanocrystalline material and the use of said material.

STATE OF THE ART

The growth of structures with at least one nanometric dimension leads to new physical properties. These nanomaterials present behaviors which significantly differ from the bulk material. Electronic[1], optical, magnetical[2] and plasmonic[3] properties are changed when the size is reduced to the nanometer scale. These new materials generate a growing interest in topic such as optic, electronic and catalysis.

Among them semiconductor colloidal nanocrystals have been deeply investigated since the early 1980's. For such materials the optical properties are strongly affected when their size is in the nanometer scale[4,5]. Their absorption is shifted toward the blue and they fluoresce at a wavelength which only depends on the considered particle size. Below a certain scale (defined by the Bohr radius of the material) quantum confinement have a significant effect. For semiconductor, this results in a larger band gap when the particle size is reduced[6]. In the case of CdSe, the Bohr radius is 5.6 nm and the bulk band gap corresponds to 710 nm. Consequently for size below 10 nm, the CdSe nanocrystals fluoresce in the blue (2 nm as diameter), the green (3 nm as diameter), orange (4 nm as diameter) and red (7 nm as diameter)[7]. The spectroscopy is consequently a key tool to characterize these nanomaterials.

The mean particle size and size distribution can be estimated using absorption or emission spectra.

The particles are typically synthesized following a two steps procedure[8] where the precursors are first nucleate and then, the formed seeds grow[9]. A solution of precursor is quickly injected at high temperature (250° C.-300° C.) in a flask filled with a mixture of organic solvent which may be coordinating or not. The nucleation occurs over a short time scale and comes with a decrease of the precursor concentration as well as a decrease of the flask temperature. The remaining precursors are used during the growth step to make the seeds grow, up to their complete use.

Up to recently, the previous procedure always leads to spherical shape nanocrystals. Over the past ten years, an intensive research has led to anisotropic shapes particles such as rods[10] or tetrapods[11]. The latter increase the zoology of possible shapes which can be reached through the nucleation-growth procedure.

Depending on the nanocrystal shape several kind of confinement can be observed. Confinement is three dimensional in the case of spherical nanocrystals (quantum dots) and bi-dimensional for rods and wires. So far only one dimensional confinement was missing in the case of colloidal nanocrystals. The latter can be obtained for thin objects (thickness smaller than the Bohr radius) with a lateral extension at least one order of magnitude larger (at least 10 nm in the case CdSe). In the following such objects will be described as nanosheets.

In this context, the nanosheets are a new kind of nanomaterials with striking physical properties. If ever their thickness is atomically controlled, such objects do present confinement only over one dimension (their thickness) resulting in:

A narrow fluorescence spectrum[12]
Short fluorescence lifetime
Large absorption cross section Moreover the ability to grow such nanocrystals with lateral extension larger than 1 µm will pave the way for new applications. The growth of ultrathin semiconductor films based on soft chemistry process will allow their uses for photovoltaic, electronic (in field effect transistor for example) or optical applications.

Over the 2000-2010 decade, the colloidal synthesis of nanosheets has been a very attractive research topic. Several syntheses of nanosheets have been developed, each of them leading to a different kind of materials. The main existing methods are the direct pealing of lamellar materials, the nanosheet growth using ligands poisoning (to stop the growth) of given crystal facets. Alternatively nanosheets can be obtained through an intermediate compounds with a lamellar structure which is topotactically transformed.

The direct pealing method is commonly used to obtain graphene, hydroxide or oxide (such as $TiO_2$) sheets. As a first step the interaction energy between layers is reduced. Then the sheets can be mechanically splitted.

For ionic compounds the increase of the interlayers distance can be obtained through a cation exchange process where the initial cations are exchanged for bulky cations such as tetrabutyl ammonium hydroxide[13]. This swelling weaks the interlayer bonds, and finally the sheets can be separated by sonication. In the case of graphene the interlayer interaction energy can be obtained using the right solvent such as N-methylpyrrolidone[14].

Such process generally leads to monosheets which are a few angstroms thick. No further growth is possible. The lateral extension is determined by the size of the bulk exfoliated object. A possible control of the thickness of the nanosheet is possible since the latter depends on the lamellar structure of the initial compound and thus to its chemical properties.

A more versatile method to obtain nanosheets of different kinds deals with the poisoning of certain crystal facets by the right surface ligands. The preferential adsorption of molecules over certain facets of the crystal avoids the growth of the material in a direction perpendicular to this facet. This results in a strongly anisotropic growth[15,16]. Such a process is commonly used for the growth of nanorods. There is a broad range of chemical nature for the poisoning molecule:

Surfactant[17]
Polymer[18]
Thiol[19]
Amines[20,21,22]
Inorganic ions[20,23]

The as synthetized material can be:
Metal nanoplatelets (using PVP[18,24,25], CTAB[26], ions[20,23])
Rare earth oxydes[22,27] (using oleic acid or oleylamine)
Sulfur compounds (using $Cu_2S$[19] aux Thiols) . . . .

In spite of its generality this poisoning method suffers from some drawbacks. It is indeed impossible to carefully control the thickness of the obtained nanosheets. Neither it is possible to obtain nanosheets which have all the same thickness (thickness monodispertsity). Additionally to the best of our knowledge there is no report of post growth lateral extension for these materials.

Alternatively it is possible to synthetize nanosheets taking advantage of a lamellar intermediate compound. This method has been successfully reported to obtain metal nanosheets (Cobalt, Nickel or Copper[28]) or oxide nanosheets (MgO[29]) though a lamellar hydroxide. Similarly, a lot of lamellar chalchogenides are obtained by forming a lamellar metal-primary amine complex which then react with a sulfur or selenium precursor. Following such a procedure nanosheets of CdSe[30], CdMnSe[31], ZnS[32,33,34,35] or In$_2$S$_3$[36] have been obtained. It is worth mentioning that a lead-thiourea lamellar complex also allows the synthesis of PbS nanosheets[37].

The latter process has for the first time allow to obtain sheets of chalogenides which thickness is defined at the atomic scale[30]. Nevertheless there is no control of the obtained thickness and there is no report for post synthesis lateral growth.

A recent method has been proposed for the synthesis of CdSe nanoplatelets[12]. In this method an acetate salt is quickly injected in a hot reaction mixture which includes selenium powder and cadmium carboxylate as precursors. There is a quick formation of nanoplatelets which generally comes with some undesired quantum dots (isotropic colloidal nanoparticles).

Some attempts for the synthesis of nanoplatelets with large lateral extension have been performed using common method from the literature[12,38]. As proposed these methods can not simply be modified to obtain pure nanosheets. The patent described in reference 38 proposes a method to obtain nanosheets with large lateral sizes. The latter describes a process where nanosheets and precursors are initially introduced in the reaction flask. Nevertheless using this method there is systematically some parasitic formation of isotropic CdSe quantum dots as well as cadmium oxide nanostructures, see FIG. 3. Some significant changes, as proposed in the following, are consequently requested to obtain methods to grow pure nanosheets with large lateral extensions free of parasitic particles.

To conclude the current methods to obtain nanosheets do not allow to synthetize particles with an atomic control of the thickness and an adjustable lateral extension from nanometer to micrometer.

Description of the Current Invention

The current invention interests to a method to synthesize colloidal nanosheets by lateral growth of at least one initial colloidal nanoparticle. The obtained material is a crystalline semiconductor associated to the formula $M_nX_y$, where M is a transition metal and X a chalchogenide. The method includes the following steps:

Preparation of a first organic solution, non or barely coordinating, behaving as a synthesis solvent and including at least one initial colloidal nanocrystal.

Preparation of a second organic solution including precursors of M, X and an acetate salt.

The slow introduction over a predetermined time scale of a predetermined amount of the second solution in a predetermined amount of the first solution, at a predetermined temperature for the growth of nanocrystals.

In one embodiment a part of the acetate salt can be introduced in the first solution.

In one embodiment the second solution include an acetate salt. The presence of the acetate salt allows the formation of nanosheets.

In one embodiment the crystalline material under a nanosheet shape has lateral extension larger than 10 nm.

In one embodiment the crystalline material under a nanosheet shape has lateral extension between 0.3 nm and 100 nm.

In one embodiment the crystalline semiconductor $M_nX_y$ is chosen among CdO, CdS, CdSe, CdTe, ZnO, ZnS, ZnSe, ZnTe, PbO, PbS, PbSe, PbTe, HgS, HgSe, HgTe, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, InP, Cd$_3$P$_2$, Zn$_3$P$_2$, FeO, Fe$_2$O$_3$, Fe$_3$O$_4$, Al$_2$O$_3$, TiO$_2$ and alloys of thereof.

In one embodiment, the at least one colloidal nanoparticle is made of CdO, CdS, CdSe, CdTe, ZnO, ZnS, ZnSe, ZnTe, PbO, PbS, PbSe, PbTe, HgS, HgSe, HgTe, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, InP, Cd$_3$P$_2$, Zn$_3$P$_2$, FeO, Fe$_2$O$_3$, Fe$_3$O$_4$, Al$_2$O$_3$, TiO$_2$ and alloy of thereof In one embodiment the material is doped with a transition metal.

In one embodiment nanocrystal seeds are introduced in the first organic solution.

In one embodiment the nanocrystal seeds are nanosheets

In one embodiment the first organic solution is made of the crude mixture resulting from the synthesis of colloidal nanocrystals previously performed.

In one embodiment the M precursor is a caboxylate salt of M, in particular an acetate salt of M, an oleate salt of M, a stearate salt of M, a myristate salt of M or a benzoate salt of M.

In one embodiment the M precursor is a phosphonatesalt of M

In one embodiment the M precursor is a dithiocarbamate or a xanthate salt of M

In one embodiment the X precursor is the X compound dissolved in a phosphine with a concentration from 0.01M up to stoechimetric proportion.

In one embodiment the X precursor is the X compound dissolved in an alcene at a concentration between 0.01M and 0.2M In one embodiment the X precursor is a fine powder of X (100 mesh for example) dispersed in a non coordinating or barely coordinating solvent.

In one embodiment a ligand is added to the second solution. This ligand might be a carboxylic acid, an amine, a thiol, a phosphine or a phosphine oxide.

In one embodiment the temperature T is between 20° C. and 350° C.

In one embodiment the second solution is added over a time scale longer than 1 hour.

In one embodiment the acetate salt is finely ground using a mortar and dispersed in the second solution.

In one embodiment the acetate salt is dissolved in a proper solvent

In one embodiment the solvent used to dissolve the acetate salt is chosen among water, ethanol, isopropanol, dimethylsulfoxide.

In one embodiment the crystalline material is CdSe and the acetate salt is cadmium acetate.

In one embodiment the first solution is chosen among 1-octadecene, trioctylamine, toluene or even benzylbenzoate.

In one embodiment the obtained nanocrystals are chalchogenides (II-VI semiconductor, IV-VI semiconductor or oxydes . . . )

In one embodiment the obtained nanocrystals have an homogeneous composition

In one embodiment the obtained nanocrystals have an heterogeneous composition. The at least one initial nanocrystal has a different composition compared to the deposited $M_nX_y$ material.

In one embodiment the obtained nanocrystals can be used as precursors to grow a thin film.

In one embodiment the obtained nanocrystals can be used as precursors to grow a semiconductor ultra thin film on a substrate at low temperature for example In one embodiment the obtained nanocrystals can be used as active element for light emitting diode, transistor or laser.

In one embodiment the obtained nanocrystals can be used as large specific area material for catalysis.

In one embodiment the obtained nanocrystals can be used for example as material for electrodes In one embodiment the obtained nanocrystals can be used as an active element of a photovoltaic cell: absorber or collector.

Other characteristic and advantages of the process depending of the invention will appear while reading the detailed description of the realization example. The latter are given as non limiting illustrations and refer to the figure given in the annexes.

Figure 2:
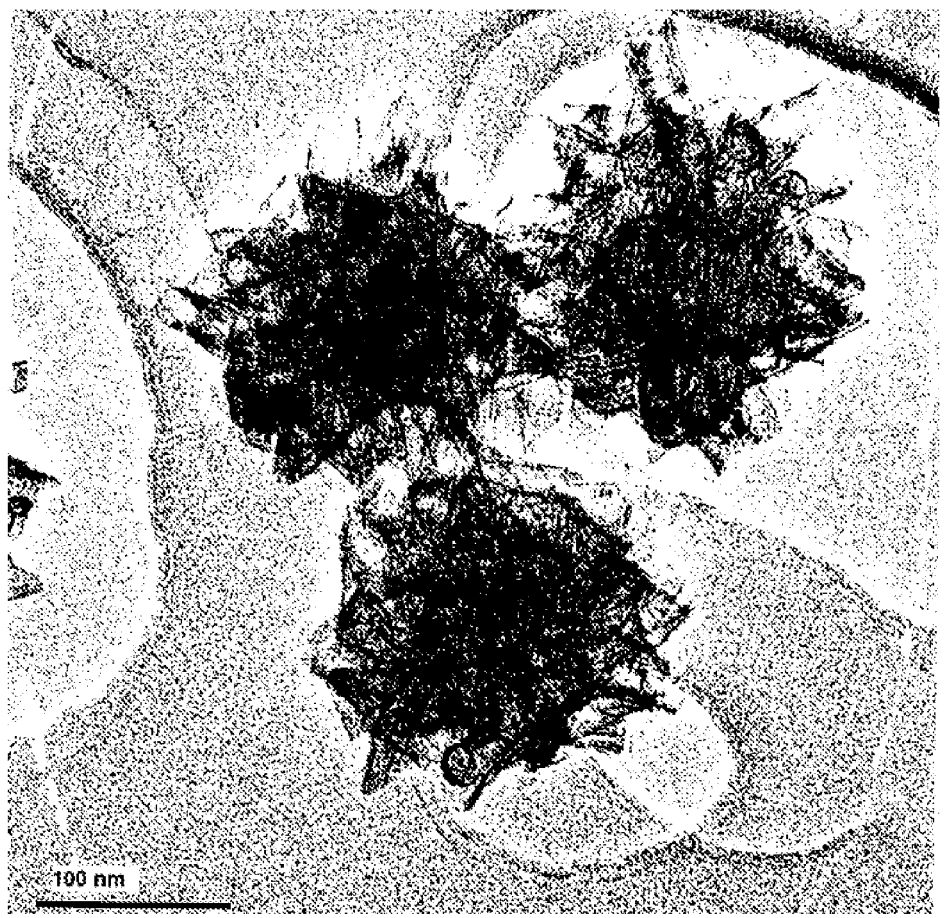
Figure 3:

FIG. 1 shows rolled sheets of CdSe emitting at 462 nm and synthetized according to example 1 as a possible realization of the current invention FIG. 2 shows aggregated sheets of CdSe emitting at 393 nm FIG. 3 shows rolled sheets of CdSe emitting at 462 nm synthetized according to a modified version of example 1 where the cadmium acetate is only in the flask (solution 1).

Figure 4:
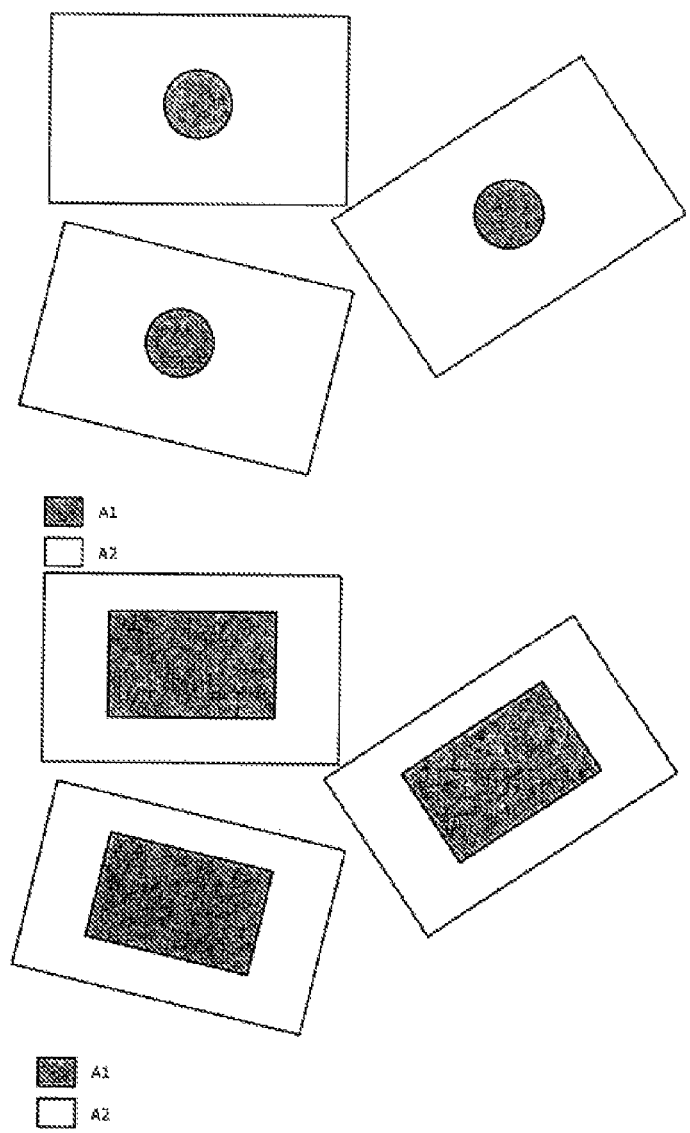

FIG. 4 shows a top view of a scheme of a heterogeneously composed sheet.

DETAILED DESCRIPTION OF THE INVENTION

Some embodiments of the invention, which will be described latter, show some bidimensional growth method of the semiconductor nanocrystals. These processes allow reaching lateral size above the micrometer while keeping the thickness constant and controlled within an atomic monolayer. It is also possible to control the thickness of the obtained nanosheets by controlling some synthesis parameters such as the precursor nature, the reaction temperature and/or the presence of nanocrystals in the reaction mixture.

These growth processes according to the current invention allow obtaining, without post synthesis purification, pure nanosheets, free of any parasitic isotropic nanocrystals.

The new process of crystalline growth confronts the paradigm nucleation/growth by quick injection of precursors at high temperature which is currently used in all organic syntheses of colloidal semiconductor nanocrystals. Indeed in one embodiment of the current invention the precursors are slowly introduced in the flask during the synthesis. The nucleation rate is controlled by the temperature of the flask and the injection speed, the system steers to a growth state at equilibrium in which all the injected precursors are consumed by the nanosheets growth, the initial nucleation leads to enough seeds in the reaction medium to consume at any time the introduced precursors. The final size of the nanosheets (its lateral dimensions) is consequently controlled by the introduced precursors.

Moreover, the growth process proposed also confronts the descriptions of syntheses of nanosheets by the method of <<soft templating>> in which a solution lamellar complex (it can be done with the acetate salt) leads the growth to the formation of nanosheets.

In one embodiment of the current invention, a solution of precursors including finely ground and well dispersed acetate salt is slowly added in the reaction mixture which can simply be a warm organic solvent, without acetate salt.

By controlling the temperature and the precursor nature, it is thus possible to control the thickness of the sheets, while their concentration is controlled by the injection speed and their lateral size is controlled by the amount of introduced precursors. The sheet geometry is in particular determined by the nature of the used acetate salt.

In the following, we will designate the nanocrystalline material binary compound by the general formula MX, M is a transition metal and X a chalchogen. The sheets which can be synthetized by the described process are CdO, CdS, CdSe, CdTe, ZnO, ZnS, ZnSe, ZnTe, PbO, PbS, PbSe, PbTe and alloy of thereof. It is also possible to grow the same previously mentioned material doped with Fe, Cu, Mn, Mg, Co . . . .

The synthesis consist in the slow introduction of M and X precursors, as well as an acetate salt in a flask including a non or barely coordinating organic solvent, as well as nanocrystals seeds.

In order to get a bidimensional growth an acetate salt is used. It can be of any kind, and the use of different acetate salts leads to different geometries of nanosheets. It should be noticed that in the case of CdSe, the use of cadmium acetate leads to square shapes sheets.

In one embodiment of the invention, the acetate salt is finely ground with a mortar and dispersed in the solution to introduce. In that case the synthesis is controlled and does not lead to the apparition of undesired compound such as isotropic nanocrystals or oxides induced by the thermal decomposition of the acetate salt. It is then possible to get nanosheets with large lateral dimensions superior to the micrometer, which is impossible if the acetate salt is directly present in the reaction medium. Indeed, in that case, it gradually damages with the synthesis and it does not lead to large pure nanosheets.

In general the M precursor used is a $M(carboxylate)_2$ made out of a fatty acid. The M precursor can also come as a M(acetate) complex. More precisely, the M precursor can be an M(oleate) complex, an M(stearate) complex or an M(myristate) complex.

The X precursor can be a liquid containing X or an homogeneous dispersion of a X powder. More precisely, the X precursor can be X dissolve in a phosphine (trioctylphosphine, tributylphosphine, triphenylphosphine, . . . ) with a concentration from 0.1M to the stoichiometry or it can be X dissolved in an alkene such as 1-octadecene with concentration from 0.01M to 0.2M The X precursor can be also of −II oxidation degree such as $H_2X$ or $Na_2X$.

The solvent can be any kind of organic solvent non or barely coordinating. More precisely, the solvent can be 1-octadecene, trioctylamine, toluene or benzylbenzoate.

The flask temperature during the precursors introduction can be in the range from 20° C. to 250° C. It depends on the precursors and on the thickness of the nanosheets we want to synthesize. In particular, the temperature can be in the range from 150° C. to 200° C.

The synthesis is preferably run under inert atmosphere (argon or nitrogen), to avoid the formation of unwanted oxides, but it can also be done in air.

EXAMPLES

The invention will be described in references to the following examples, as illustrations but non limiting.

Example 1: Synthesis of Nanosheets Emitting at 462 nm

In a 100 ml three necks flask, 10 ml of 1-octadecene are introduced with 40 mg of $Cd(Acetate)_2,2H_2O$ previously ground in a mortar. The mixture is magnetically stirred and degassed under vacuum for 30 minutes. The reaction medium is then passed under inert atmosphere (argon) and heated at 180° C.

Simultaneously, a mixture of 40 mg of $Cd(Acetate)_2$, $2H_2O$ previously ground in a mortar, 240 mg of $Cd(myristate)_2$ and 4 ml of trioctylamine are heated under stirring until complete dissolution of $Cd(myristate)_2$. 4 ml of a solution of selenium in ODE at 0.1M is then added. The mixture forms a gel by cooling down.

This gel is injected over 2 hours at 180° C. in the reactive medium, leading to the nucleation and the growth of nanosheets with lateral dimensions larger than 200 nm.

Example 2: Growth of Nanosheets Emitting at 510 nm

In a 100 ml three necks flask, 10 ml of 1-octadecene are introduced with 40 mg of $Cd(Acetate)_2,2H_2O$ previously crushed in a mortar and 10 nmol of CdSe nanocrystals synthesized through the method describe in reference[12]. The mixture is magnetically stirred and degassed under vacuum for 30 minutes. The reaction medium is then brought under inert atmosphere (argon) and heated at 180° C.

Simultaneously, a mixture of 40 mg of $Cd(Acetate)_2$, $2H_2O$ previously ground in a mortar, 240 mg of $Cd(myristate)_2$ and 4 ml of trioctylamine are heated under stirring until complete dissolution of $Cd(Myristate)_2$. 4 ml of a solution of selenium in ODE at 0.1M is then added. The mixture forms a gel by cooling down.

This gel is injected over 4 hours at 200° C. in the reactive medium, leading to the nucleation and the growth of nanosheets with lateral dimensions larger than 100 nm.

In an other embodiment of the invention:

In a 100 ml three necks flask, 10 ml of 1-octadecene are introduced with 10 nmol of CdSe nanocrystals synthesized through the method describe in reference[12]. The mixture is magnetically stirred and degassed under vacuum for 30 minutes. The reaction medium is then brought under inert atmosphere (argon) and heated at 240° C.

Simultaneously, a mixture of 96 mg of $Cd(Acetate)_2$, $2H_2O$ previously ground in a mortar dissolved in 1 ml of ethanol, 46 µl of oleic acid, 1 ml of butanol and 4 ml of a solution of selenium in ODE at 0.1M is prepared.

This solution is injected in 10 minutes at 240° C. in the reactive medium, leading to the nucleation and the growth of nanosheets with lateral dimensions larger than 100 nm.

Example 3: Synthesis of Nanosheets Emitting at 393 nm 10 ml of toluene is introduced in a 100 ml three necks flask. The flask is heated at 100° C., while a syringe containing 5 ml of toluene, 133 mg of $Cd(Acetate)_2,2H_2O$, 30 mg of benzoic acid and 100 µl of stoichiometric TOPSe is prepared.

The syringe is then injected over 1 hour, with a speed of 5 ml/h in the hot flask of toluene.

The reactive medium slowly gets cloud, indicating the formation of large nanosheets emitting at 393 nm.

These are separated from the reactive medium via centrifugation and resuspended in toluene.

This new path of fabrication of nanocrystals following the examples presented allows the control of the thickness and the tuning of the lateral dimensions of the obtained nanosheets. It opens the way to new applications for these materials in domains as diversify as photovoltaic, electronic and optic.

The lateral dimensions are controlled through the quantity of precursors introduced while the thickness is control by the synthesis parameters: temperature, precursors and the initial presence of nanocrystals in the reaction medium.

It has been noticed that the syntheses of nanosheets following the exposed procedures minimize the formation of spherical nanocrystals and the reaction of acetate salt decomposition. Especially, a slow injection of the precursors and a thin powder of the acetate salt totally avoid from the undesired reaction such as the formation of spherical nanocrystals and thus allow to obtain pure nanosheets.

Exemple 4

Growth of Nanosheets CdSe/CdS

In a 100 mL three necks flask, 10 ml of 1-octadecene (ODE) are introduced with 10 nmol of CdSe nanocrystals synthetized according to the method described in ref 12. The mixture is magnetically stirred and degassed for 30 minutes. The reaction atmosphere is switched to Argon and the solution warmed at 240° C.

In the meanwhile a mixture composed of 96 mg of $Cd(Acetate)_2,2H_2O$ dissolved in 1 ml of ethanol, 46 µL of oleic acid, 1 m of butanol and 4 mL of sulfur in ODE at 0.1M is prepared.

This solution is injected over 30 minutes at 240° C. in the reaction mixture, leading to the growth of core/crown nanosheets of CdSe/CdS with lateral size larger than 50 nm.

The structure of the core/crown sheets is schematized on FIG. 4, where A1 is CdSe and A2 is the CdS.

The invention claimed is:

1. A colloidal nanosheet comprising:
   one first portion comprising an initial colloidal crystalline nanosheet completely surrounded laterally, and not in a thickness, by a second adjacent extended portion having a semiconductor material represented by the formula $M_nX_y$, wherein M is selected from the group consisting of Cd, Zn, Pb, Hg, Cu, In, Ag, Fe, Al, Ti, or a mixture thereof, and X is selected from the group consisting of O, S, Se, Te, P, or a mixture thereof, wherein
   the initial colloidal crystalline nanosheet has a different composition compared to the $M_nX_y$ material of the second adjacent extended portion, thereby forming different semiconductor regions, and
   the initial colloidal crystalline nanosheet is made of CdO, CdS, CdSe, CdTe, ZnO, ZnS, ZnSe, ZnTe, PbO, PbS, PbSe, PbTe, HgS, HgSe, HgTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, FeO, $Fe_2O_3$, $Fe_3O_4$, $Al_2O_3$, $TiO_2$, or an alloy thereof.

2. The colloidal nanosheet according to claim 1, wherein said crystalline semiconductor material MnXy is a compound selected from the group consisting of CdO, CdS, CdSe, CdTe, ZnO, ZnS, ZnSe, ZnTe, PbO, PbS, PbSe, PbTe, HgS, HgSe, HgTe, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, InP, Cd$_3$P$_2$, Zn$_3$P$_2$, FeO, Fe$_2$O$_3$, Fe$_3$O$_4$, Al$_2$O$_3$, TiO$_2$ and alloy thereof.

3. The colloidal nanosheet according to claim 1, wherein said semiconductor crystalline M$_n$X$_y$ material is doped by a transition metal.

4. The colloidal nanosheet according to claim 1, wherein said colloidal nanosheet has a lateral size larger than 10 nm.

5. A large specific area material for catalysis comprising the colloidal nanosheet according to claim 1.

6. A light emitting diode comprising the colloidal nanosheet according to claim 1 as an active element.

7. A solar cell comprising the colloidal nanosheet according to claim 1 as an active element in an absorber and or in a collector of photogenerated charges.

8. A method of preparing a semiconductor ultrathin film comprising building said semiconductor ultrathin film on a substrate at low temperature from the colloidal nanosheet according to claim 1.

9. A colloidal nanosheet having a lateral extension larger than 10 nm comprising:
one first portion comprising an initial colloidal nanocrystal nanosheet surrounded laterally on all sides, and not in a thickness, by a continuous second adjacent extended portion having a semiconductor material represented by the formula M$_n$X$_y$, wherein M is selected from the group consisting of Cd, Zn, Pb, Hg, Cu, In, Ag, Fe, Al, Ti, or a mixture thereof, and X is selected from the group consisting of O, S, Se, Te, P, or a mixture thereof, wherein
the initial colloidal nanocrystal nanosheet has a different composition compared to the M$_x$X$_y$ material of the continuous second adjacent extended portion, thereby forming different semiconductor regions, and
wherein the one first portion comprising an initial colloidal nanocrystal nanosheet surrounded laterally on all sides is a semiconductor material.

* * * * *